United States Patent
Asuka et al.

(10) Patent No.: US 10,946,879 B2
(45) Date of Patent: Mar. 16, 2021

(54) RAIL FRACTURE DETECTION DEVICE

(71) Applicant: MITSUBISHI ELECTRIC CORPORATION, Tokyo (JP)

(72) Inventors: Masashi Asuka, Tokyo (JP); Tomoaki Takewa, Tokyo (JP); Wataru Tsujita, Tokyo (JP); Yoshitsugu Sawa, Tokyo (JP); Daisuke Koshino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 240 days.

(21) Appl. No.: 16/077,227

(22) PCT Filed: Jan. 13, 2017

(86) PCT No.: PCT/JP2017/001131
§ 371 (c)(1),
(2) Date: Aug. 10, 2018

(87) PCT Pub. No.: WO2017/175439
PCT Pub. Date: Oct. 12, 2017

(65) Prior Publication Data
US 2019/0047600 A1   Feb. 14, 2019

(30) Foreign Application Priority Data

Apr. 4, 2016   (WO) .................. PCT/JP2016/061037

(51) Int. Cl.
*B61L 23/04*   (2006.01)
*E01B 35/00*   (2006.01)
(Continued)

(52) U.S. Cl.
CPC ............ *B61L 23/044* (2013.01); *B61L 1/181* (2013.01); *B61L 23/04* (2013.01); *E01B 35/00* (2013.01);
(Continued)

(58) Field of Classification Search
CPC .......... B61L 1/181; B61L 1/185; B61L 1/187; B61L 23/04; B61L 23/044; B61L 25/025;
(Continued)

(56) References Cited

U.S. PATENT DOCUMENTS 5,417,388 A     5/1995  Stillwell
5,583,769 A *  12/1996  Saitoh ..................... B61L 3/008
                                                                    701/79

(Continued)

FOREIGN PATENT DOCUMENTS

DE       3738696 A1    5/1989
JP       05008727 A    1/1993
(Continued)

OTHER PUBLICATIONS

Extended European Search Report dated Jun. 27, 2019 for the corresponding European patent application No. 17778818.9, 10 pages.
(Continued)

*Primary Examiner* — Mark T Le
(74) *Attorney, Agent, or Firm* — Buchanan Ingersoll & Rooney PC

(57) ABSTRACT

The rail fracture detection device detects a rail fracture in a section provided with the track circuit by determining presence or absence of a rail fracture and determining presence or absence of a train on a rail by using information on whether a relay of the track circuit is activated or deactivated and information on a current value of current flowing in the track circuit.

11 Claims, 8 Drawing Sheets

(51) Int. Cl.
  *B61L 1/18* (2006.01)
  *G01R 31/50* (2020.01)
  *B61L 25/02* (2006.01)
  *B61L 3/22* (2006.01)

(52) U.S. Cl.
  CPC .............. *G01R 31/50* (2020.01); *B61L 1/185* (2013.01); *B61L 1/187* (2013.01); *B61L 3/221* (2013.01); *B61L 25/025* (2013.01); *B61L 25/026* (2013.01)

(58) Field of Classification Search
  CPC ........ B61L 25/026; B61L 3/221; B61L 1/188; B61L 27/0088; B61L 3/10; B61L 27/00; B61L 25/02; B61L 25/023; B61L 29/32; E01B 35/00; G01R 31/50
  See application file for complete search history.

(56) References Cited

U.S. PATENT DOCUMENTS

| | | | |
|---|---|---|---|
| 5,680,054 A | 10/1997 | Gauthier | |
| 6,102,340 A * | 8/2000 | Peek | B61L 23/044 246/121 |
| 9,701,326 B2 * | 7/2017 | Kull | B61L 23/044 |
| 2008/0105791 A1 * | 5/2008 | Karg | B61L 23/044 246/120 |
| 2013/0240679 A1 | 9/2013 | Beacham et al. | |
| 2015/0158510 A1 | 6/2015 | Fries et al. | |
| 2016/0075356 A1 | 3/2016 | Kull | |

FOREIGN PATENT DOCUMENTS

| | | |
|---|---|---|
| JP | 2003011816 A | 1/2003 |
| JP | 2005038656 A | 2/2005 |
| JP | 2011057005 A | 3/2011 |
| JP | 2012188009 A | 10/2012 |
| JP | 2013043618 A | 3/2013 |

OTHER PUBLICATIONS

International Search Report (PCT/ISA/210) dated Apr. 4, 2017, by the Japanese Patent Office as the International Searching Authority for International Application No. PCT/JP2017/001131.
Office Action dated Jun. 28, 2018, in Japanese Application No. 2018-510233.
Written Opinion (PCT/ISA/237) dated Apr. 4, 2017, by the Japanese Patent Office as the International Searching Authority for International Application No. PCT/JP2017/001131.
International Search Report (PCT/ISA/210) dated May 10, 2016, by the Japanese Patent Office as the International Searching Authority for International Application No. PCT/JP2016/061037.
European Office Action dated Jun. 29, 2020 for corresponding European Patent Application No. 17778818.9, 8 pages.

* cited by examiner

RAIL FRACTURE DETECTION DEVICE

FIELD

The present invention relates to a rail fracture detection device that can be used with rails provided with a track circuit.

BACKGROUND

In the conventional technologies, whether a relay of a track circuit is activated or deactivated is detected on the rails provided with the track circuit. When the relay of the track circuit is activated, it is determined that a train is not present on the rails, and when the relay of the track circuit is deactivated, it is determined that a train is present on the rails or there is a fractured part in a rail. It is thus impossible in the conventional technologies to distinguish between the presence of a train on the rails and the occurrence of a fractured part in a rail.

With the conventional technology disclosed in Patent Literature 1, it is possible to, by using train positional information, distinguish between the rail fracture and the presence of a train on the rails.

CITATION LIST

Patent Literature

Patent Literature 1: Japanese Patent Application Laid-Open No. 2012-188009

SUMMARY

Technical Problem

However, with the conventional technology, train positional information is necessary. Thus, both on-board information and ground information are required and cooperation between ground devices and on-board devices is required. This leads to a problem in that the system becomes complicated.

The present invention is made in view of the above, and an object of the present invention is to provide a rail fracture detection device capable of detecting a fracture of a rail in a track circuit without using train positional information.

Solution to Problem

In order to solve the above problems and achieve the object, a rail fracture detection device according to an aspect of the present invention detects a rail fracture in a section provided with a track circuit by determining presence or absence of a rail fracture and determining presence or absence of a train on a rail by using information on whether a relay of the track circuit is activated or deactivated and information on a current value of a current flowing in the track circuit.

Advantageous Effects of Invention

According to the present invention, an effect is obtained where a fracture of a rail in a track circuit can be detected without using train positional information.

DESCRIPTION OF EMBODIMENTS

A rail fracture detection device according to embodiments of the present invention will be described below in detail with reference to the drawings. Note that the present invention is not limited by the embodiments.

First Embodiment

Figure 1:
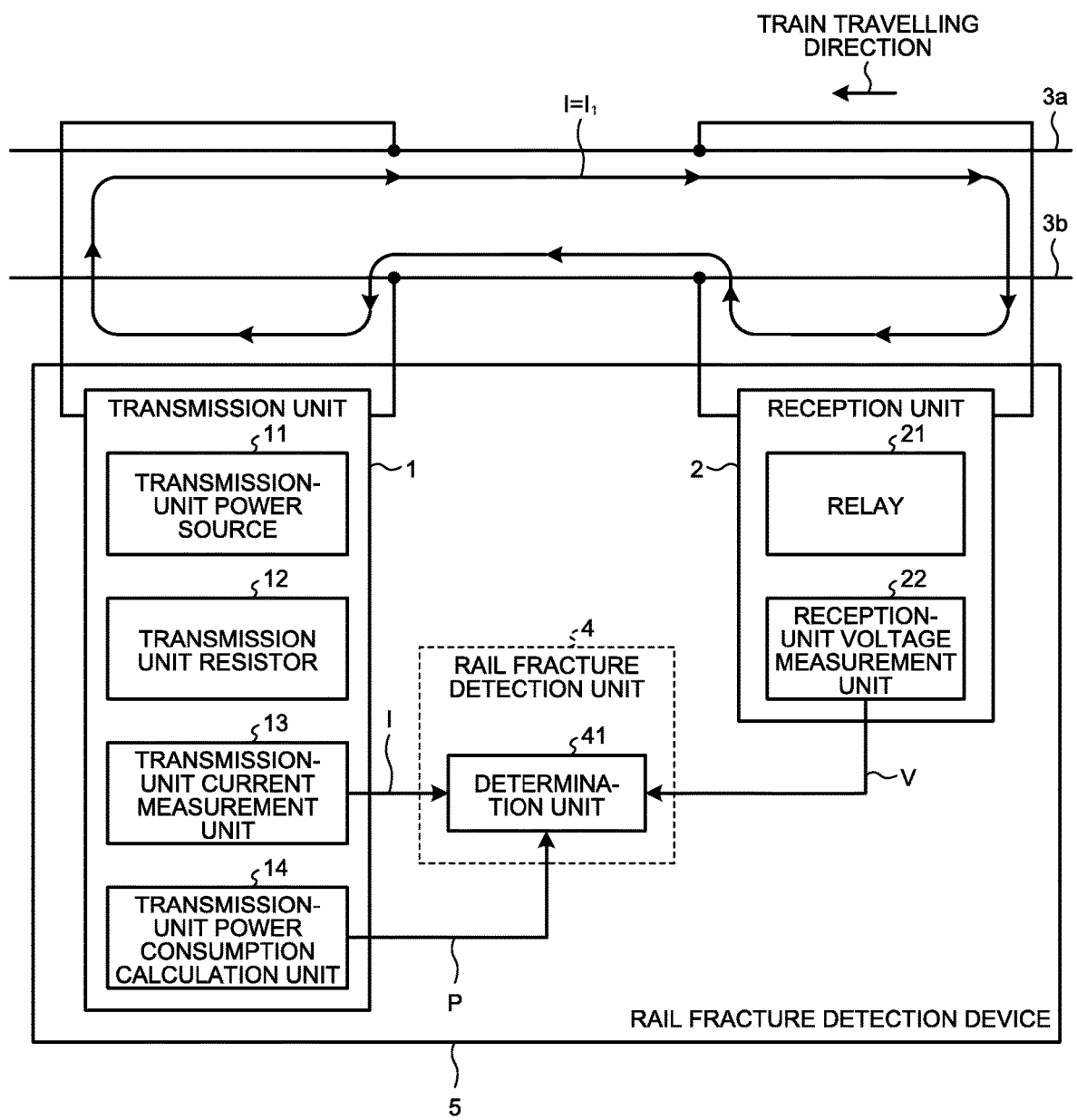
FIG. 1 is a diagram illustrating an exemplary configuration of a rail fracture detection device according to a first embodiment.

FIG. 1 is a diagram illustrating an exemplary configuration of a rail fracture detection device according to a first embodiment of the present invention. A rail fracture detection device 5 illustrated in FIG. 1 includes a transmission unit 1; a reception unit 2; rails 3a and 3b to which the transmission unit 1 and the reception unit 2 are electrically connected; and a rail fracture detection unit 4. Here, one section of a track circuit is illustrated in FIG. 1, and the travelling direction of a train is in the direction from the reception unit 2 toward the transmission unit 1.

The transmission unit 1 includes a transmission-unit power source 11; a transmission-unit resistor 12; a transmission-unit current measurement unit 13; and a transmission-unit power consumption calculation unit 14. The transmission-unit power source 11 is a DC power source connected in series between the rail 3a and the rail 3b. The transmission-unit resistor 12 is a resistor connected in series with the transmission-unit power source 11. The transmission-unit current measurement unit 13 measures the current flowing through the transmission-unit resistor 12 and outputs a current measurement value I. The current measurement value I is input to the rail fracture detection unit 4. The transmission-unit power consumption calculation unit 14 measures the power consumption of the transmission unit 1 and outputs a power consumption measurement value P. The power consumption measurement value P is calculated by multiplying the voltage of the transmission-unit power source 11 by the current measurement value I measured by the transmission-unit current measurement unit 13.

The reception unit 2 includes a relay 21 and a reception-unit voltage measurement unit 22. The reception-unit voltage measurement unit 22 measures the voltage applied to the relay 21 and outputs a voltage measurement value V. In a case where the voltage applied to the relay 21 is lower than a preset threshold value, the relay 21 is deactivated, and in a case where the applied voltage is greater than or equal to the preset threshold value, the relay 21 of the track circuit is activated. In a case where power is not supplied to the reception unit 2 due to a malfunction, the relay is deactivated and a train cannot enter the section of this track circuit.

One end of the transmission unit 1 and one end of the reception unit 2 are connected to the rail 3a, and the other end of the transmission unit 1 and the other end of the reception unit 2 are connected to the rail 3b.

The rail fracture detection unit 4 includes a determination unit 41. The determination unit 41 receives the current measurement value I from the transmission-unit current measurement unit 13, the voltage measurement value V from the reception-unit voltage measurement unit 22, and the power consumption measurement value P.

In FIG. 1, no train is present on the rails in the section of the track circuit. Thus, the current from the transmission unit 1 passes through the rail 3a, flows to the rail 3b via the reception unit 2, passes through the rail 3b, and then flows to the transmission unit 1. The current measurement value I of the transmission-unit current measurement unit 13 at this point is defined as $I_1$.

Figure 2:
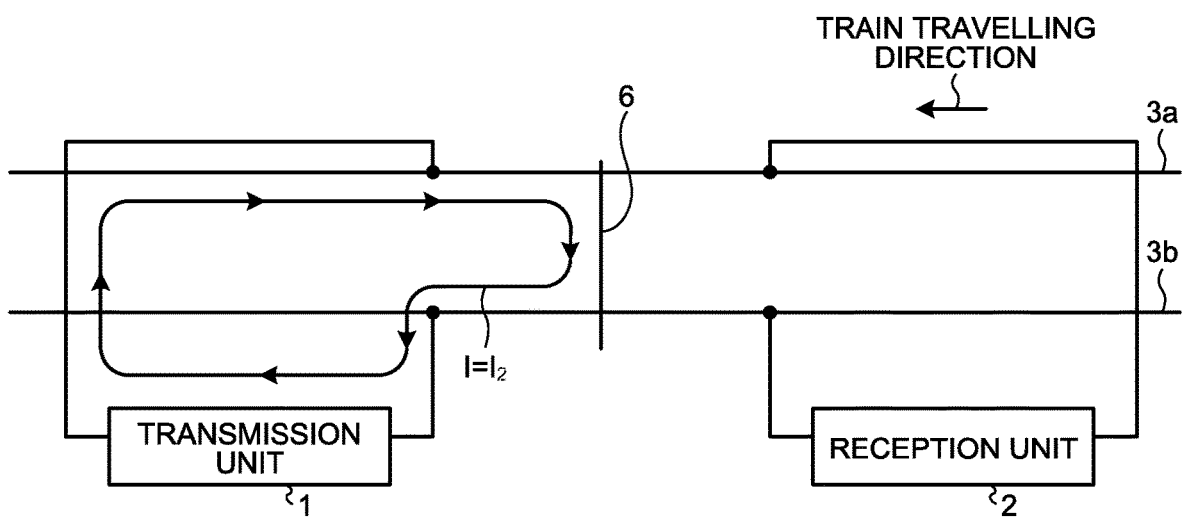
FIG. 2 is a diagram illustrating an exemplary schematic configuration when a train is present on the rails in a section of a track circuit illustrated in FIG. 1.

FIG. 2 is a diagram illustrating an exemplary schematic configuration when a train is present on the rails in the section of the track circuit illustrated in FIG. 1. FIG. 2 does not illustrate the train present on the rails but illustrates an axle 6 of the train present on the rails. The axle 6 short-circuits the rail 3a and the rail 3b. Thus, in FIG. 2, the current from the transmission unit 1 passes through the rail 3a and flows to the rail 3b via the axle 6. In other words, the current is short-circuited by the axle 6. The current measurement value I of the transmission-unit current measurement unit 13 at this point is defined as $I_2$.

Figure 3:
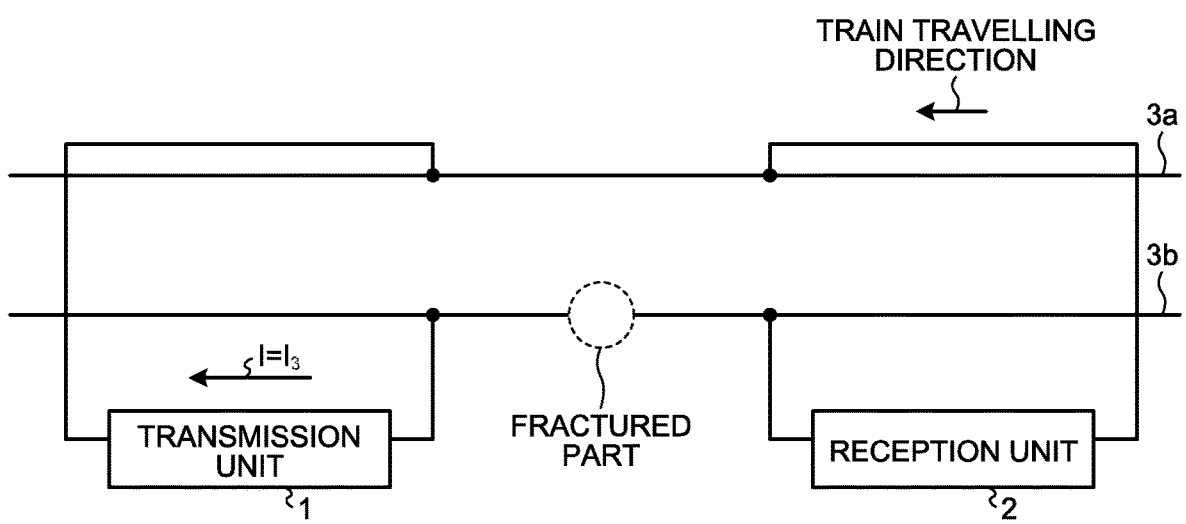
FIG. 3 is a diagram illustrating an exemplary schematic configuration when a rail fracture occurs in the section of the track circuit illustrated in FIG. 1.

FIG. 3 is a diagram illustrating an exemplary schematic configuration when a rail fracture occurs in the section of the track circuit illustrated in FIG. 1. In FIG. 3, there is a fractured part in the rail 3b and thus a current path is blocked in FIG. 3 and only a weak current flows. The current measurement value I of the transmission-unit current measurement unit 13 at this point is defined as $I_3$. This weak current value $I_3$ is set as a current threshold value to perform a determination process.

Figure 4:
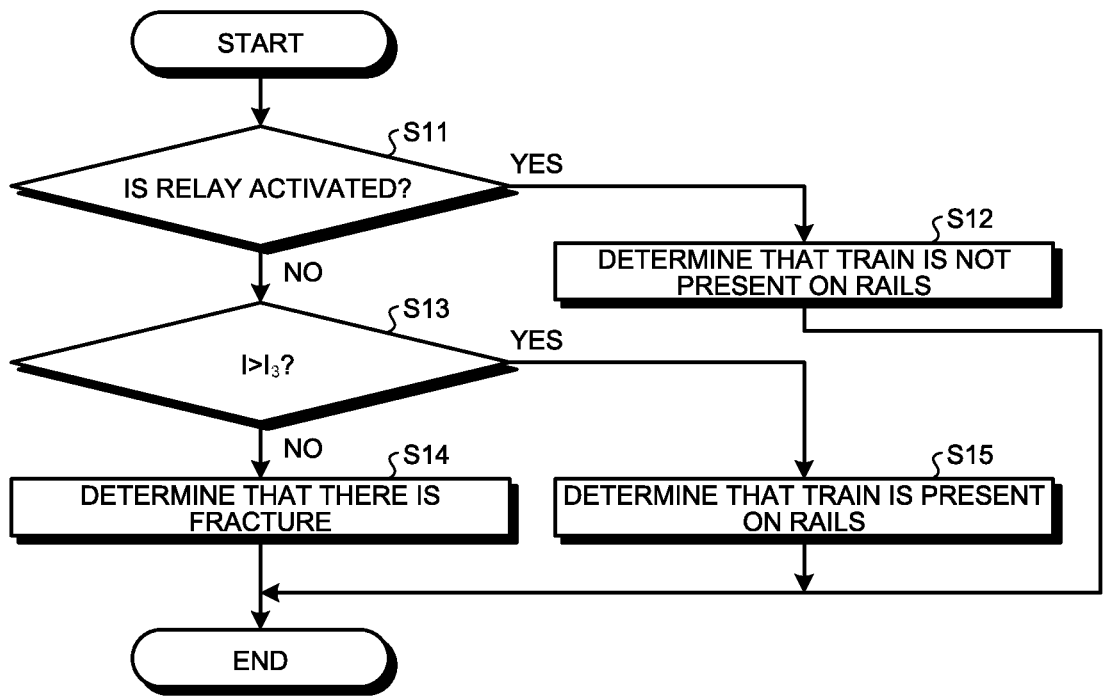
FIG. 4 is a flowchart illustrating an exemplary operation of a determination unit of the rail fracture detection device according to the first embodiment.

FIG. 4 is a flowchart illustrating an exemplary operation of the determination unit 41 of the rail fracture detection unit 4 illustrated in FIG. 1. First, the processing is started, and the determination unit 41 determines whether the relay of the track circuit in the section that is a determination target is activated (S11). Here, the voltage measurement value V of the reception-unit voltage measurement unit 22 is used to determine whether the relay of the track circuit is activated. When the voltage measurement value V is greater than or equal to a preset threshold value, the relay of the track circuit is activated. When the voltage measurement value V is lower than the preset threshold value, the relay of the track circuit is deactivated. When the relay of the track circuit is activated (S11: Yes), the determination unit 41 determines that there is no rail fracture in the section of the track circuit and a train is not present on the rails (S12). When the relay of the track circuit is not activated (S11: No), i.e., when the relay of the track circuit is deactivated, the determination unit 41 determines whether the current value I of the transmission-unit current measurement unit 13 is larger than $I_3$ (S13). When the current value I is not larger than $I_3$ (S13: No), i.e., when the current value I=$I_3$, the determination unit 41 determines that there is a fracture in the section of the track circuit (S14). When the current value I is larger than $I_3$ (S13: Yes), the determination unit 41 determines that there is no rail fracture in the section of the track circuit but a train is present on the rails (S15). In other words, when the relay is deactivated and the current value I is larger than $I_3$, the determination unit 41 determines that a train is present on the rails in the track circuit. Alternatively, when the voltage measurement value V is lower than the preset voltage threshold value and the current value I is larger than $I_3$, the determination unit 41 determines that a train is present on the rails in the track circuit.

Note that, in S13 of FIG. 4, the determination unit 41 determines whether the current value I of the transmission-unit current measurement unit 13 is larger than $I_3$, but the present invention is not limited thereto. The determination unit 41 may determine whether the current value I of the transmission-unit current measurement unit 13 is larger than a preset determination threshold value $I_0$.

As described above, the determination unit 41 can determine whether there is a rail fracture in the section of the track circuit.

In a case where the determination unit 41 determines that there is a rail fracture, a train is stopped or the train is made to travel slowly.

In a case where the determination unit 41 cannot acquire the current measurement value I from the transmission-unit current measurement unit 13 due to a malfunction of the transmission unit 1 or in a case where the determination unit 41 cannot acquire the voltage measurement value V from the reception-unit voltage measurement unit 22, the train is stopped or the train is made to travel slowly in a manner similar to when a rail fracture is detected.

Figure 5:
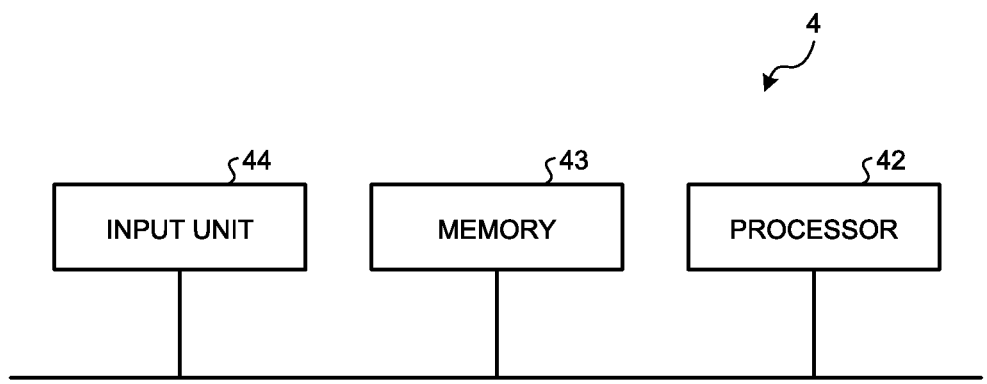
FIG. 5 is a diagram illustrating an exemplary general configuration of hardware to implement the rail fracture detection device according to the first embodiment.

Note that, in the first embodiment, the rail fracture detection unit 4 includes at least a processor, a memory, and an input unit, and the operation of the respective devices can be implemented by software. FIG. 5 is a diagram illustrating an exemplary general configuration of hardware to implement the rail fracture detection unit 4 according to the first embodiment. The devices illustrated in FIG. 5 include a processor 42, a memory 43, and an input unit 44. The processor 42 uses received data to execute calculations and control with software. The memory 43 stores the received data or data and software necessary for the processor 42 to execute calculations and control. The input unit 44 receives the current measurement value I from the transmission-unit current measurement unit 13 and the voltage measurement value V from the reception-unit voltage measurement unit 22. A plurality of processors 42 and a plurality of memories 43 may be provided.

As described above, the rail fracture detection device according to the first embodiment uses information on whether the relay of the track circuit is activated or deactivated and information on the value of the current flowing through the track circuit to detect a rail fracture in the section provided with the track circuit. Specifically, the rail fracture detection device according to the first embodiment includes: the reception unit 2 that is provided between the two rails 3a and 3b and that includes the relay 21 of the track circuit; the transmission unit 1 that is provided between the two rails 3a and 3b but is located after the reception unit 2 in the travelling direction of a train and that forms a current loop with the reception unit 2 and the two rails 3a and 3b; and the determination unit 41 to determine whether there is a fracture in the two rails 3a and 3b on the basis of the information from the reception unit 2 and the information from the transmission unit 1. The reception unit 2 includes the reception-unit voltage measurement unit 22 to measure the voltage applied to the relay 21. The transmission unit 1 includes the transmission-unit power source 11 to generate current; the transmission-unit resistor 12 connected in series with the transmission-unit power source 11; and the transmission-unit current measurement unit 13 to measure the current in the transmission-unit resistor 12. The determination unit 41 determines whether there is a fracture in the two rails 3a and 3b by using the current measurement value of the transmission-unit current measurement unit 13 and the voltage measurement value of the reception-unit voltage measurement unit 22.

With the conventional technology, whether a relay of a track circuit is activated or deactivated is detected, and in a case where the relay of the track circuit is activated, it is determined that a train is not present on the rails, and in a case where the relay of the track circuit is deactivated, it is determined that a train is present on the rails or there is a fractured part in a rail. It is therefore not possible to distinguish between when a train is present on the rails and when there is a fractured part in a rail.

Accordingly, with the conventional technology, in the case where the relay of the track circuit is deactivated, it is possible to distinguish between when a train is present on the rails and when there is a fractured part in a rail by referring to train positional information and determining whether the train positional information is included in the track circuit. However, with such a technology, it is necessary to refer to the train positional information that is on-board information and thus both the on-board information and ground information are required. Thus, there is a problem in that the system becomes complicated. Additionally, the train positional information detected on the train is affected by idling or slippage of the wheels of the train, and therefore, there is a problem in that the train positional information lacks accuracy.

According to the first embodiment, a fracture of a rail in a track circuit can be detected by using a voltage value of the reception unit in the track circuit and a current value of the transmission unit. Thus, it is possible to detect a fracture of a rail in the track circuit only by using the information on the ground side without referring to the train positional information that is on-board information. Therefore, a fracture of a rail in the track circuit can be detected without any cooperation between a ground device and an on-board device.

Additionally, it is also possible to detect a rail fracture by using a return current. However, in a case where the return current is used, it is necessary that a train be in a power running operation or in a regenerative operation. According to the first embodiment, a rail fracture can be detected even in a state when a train is not present on the rails in a track circuit.

Furthermore, the first embodiment can be implemented by a simple configuration, and therefore, the first embodiment can be installed at low cost.

In the above description, the determination unit 41 detects a rail fracture by using both the current measurement value I from the transmission-unit current measurement unit 13 and the voltage measurement value V from the reception-unit voltage measurement unit 22, but the present invention is not limited thereto. It is possible to use only the current measurement value I from the transmission-unit current measurement unit 13 without using the voltage measurement value V from the reception-unit voltage measurement unit 22. In other words, because the current measurement value $I=I_1$ in a case where a train is not present on the rails within the section of the track circuit, the current measurement value $I=I_2$ in a case where a train is present on the rails in the section of the track circuit, and the current measurement value $I=I_3$ in a case where a rail fracture occurs are different values, the presence of a train on the rails, the absence of a train on the rails, and the occurrence of a rail fracture can be distinguished from each other by focusing on such differences between the current measurement values. Here, in the case where a train is present on the rails in the section of the track circuit, the current is large because the current path is short-circuited by the axle 6, but in a case where no train is present on the rails in the section of the track circuit, the current path is not short-circuited and passes through the reception unit 2. Therefore, the relationship $I_2 > I_1$ holds.

In the first embodiment, a rail fracture is detected by using the current of the transmission unit 1 and the voltage of the reception unit 2, but a rail fracture may also be detected by calculating power consumption in the transmission unit 1 by the transmission-unit power consumption calculation unit 14 provided in the transmission unit 1.

In the first embodiment, a DC track circuit is exemplified as the track circuit, but the present invention is not limited thereto, and an AC current track circuit may be used as the track circuit. Furthermore, the track circuit is exemplified in the first embodiment, but the present invention is not limited thereto, and an electric circuit may also be used.

Note that the first embodiment is preferably used in a section including a curved portion of a railroad. The reason is that a rail fracture is more likely to occur in a curved portion of a railroad due to the friction with the wheels. It is particularly preferable for the first embodiment to be used in a curved portion having a small radius of curvature of a railroad.

The first embodiment is also preferably used in a section including a welded portion of a railroad. The reason is that a rail fracture is more likely to occur in a welded portion of a railroad.

Second Embodiment

Figure 6:
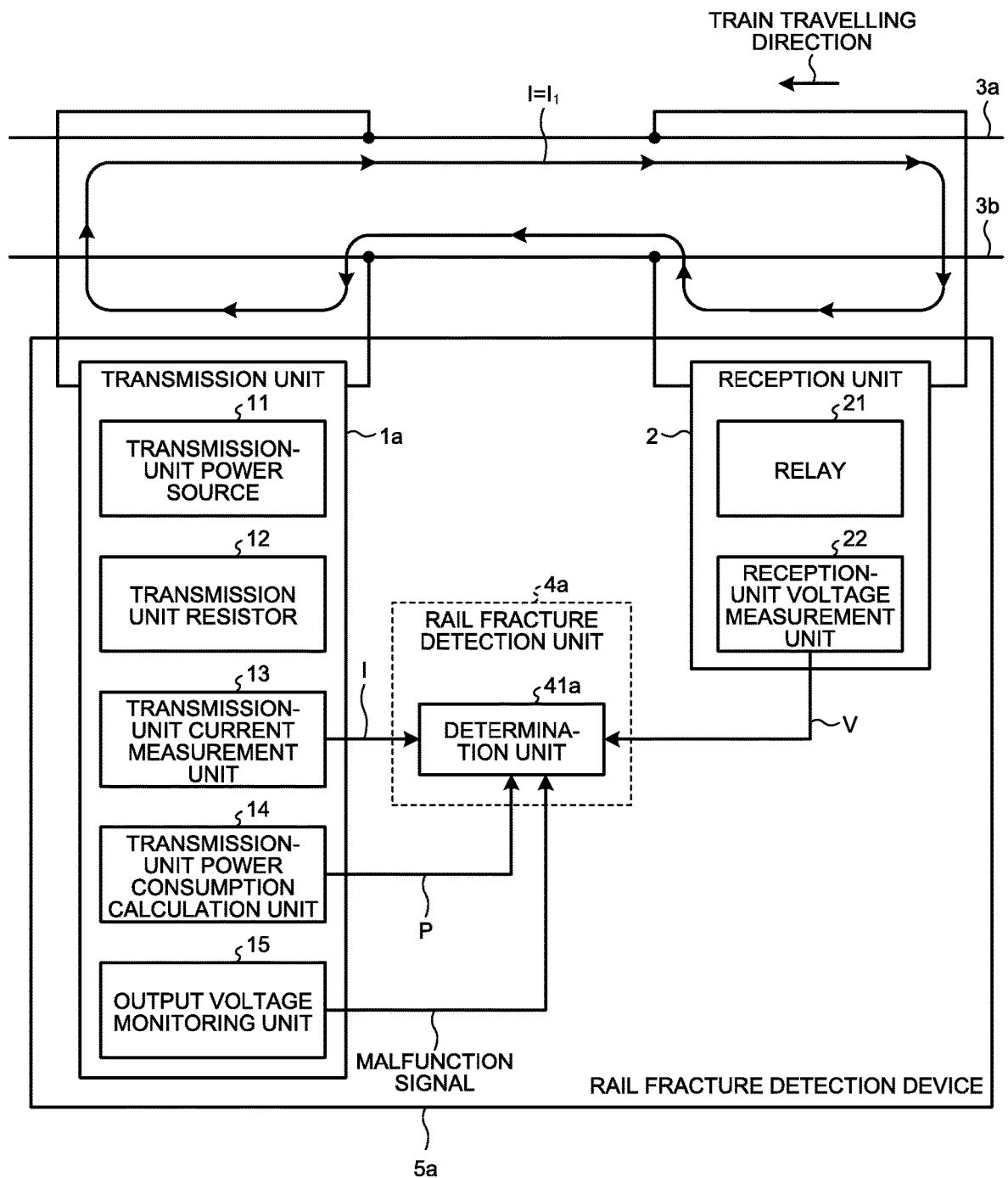
FIG. 6 is a diagram illustrating an exemplary configuration of a rail fracture detection device according to a second embodiment.

FIG. 6 is a diagram illustrating an exemplary configuration of a rail fracture detection device according to a second embodiment of the present invention. A rail fracture detection device 5a illustrated in FIG. 6 differs from the rail fracture detection device 5 illustrated in FIG. 1 in that the former includes a transmission unit 1a in place of the transmission unit 1 and includes a rail fracture detection unit 4a in place of the rail fracture detection unit 4. Any points not specifically mentioned here are referred to in the first embodiment.

The transmission unit 1a has a configuration in which an output voltage monitoring unit 15 is added to the transmission unit 1 illustrated in FIG. 1. The output voltage monitoring unit 15 monitors the output voltage of the transmission-unit power source 11, and it outputs a malfunction signal when the output voltage exceeds a preset voltage value range. The rail fracture detection unit 4a differs from the rail fracture detection unit 4 illustrated in FIG. 1 in that it includes a determination unit 41a to which this malfunction signal is input.

Figure 7:
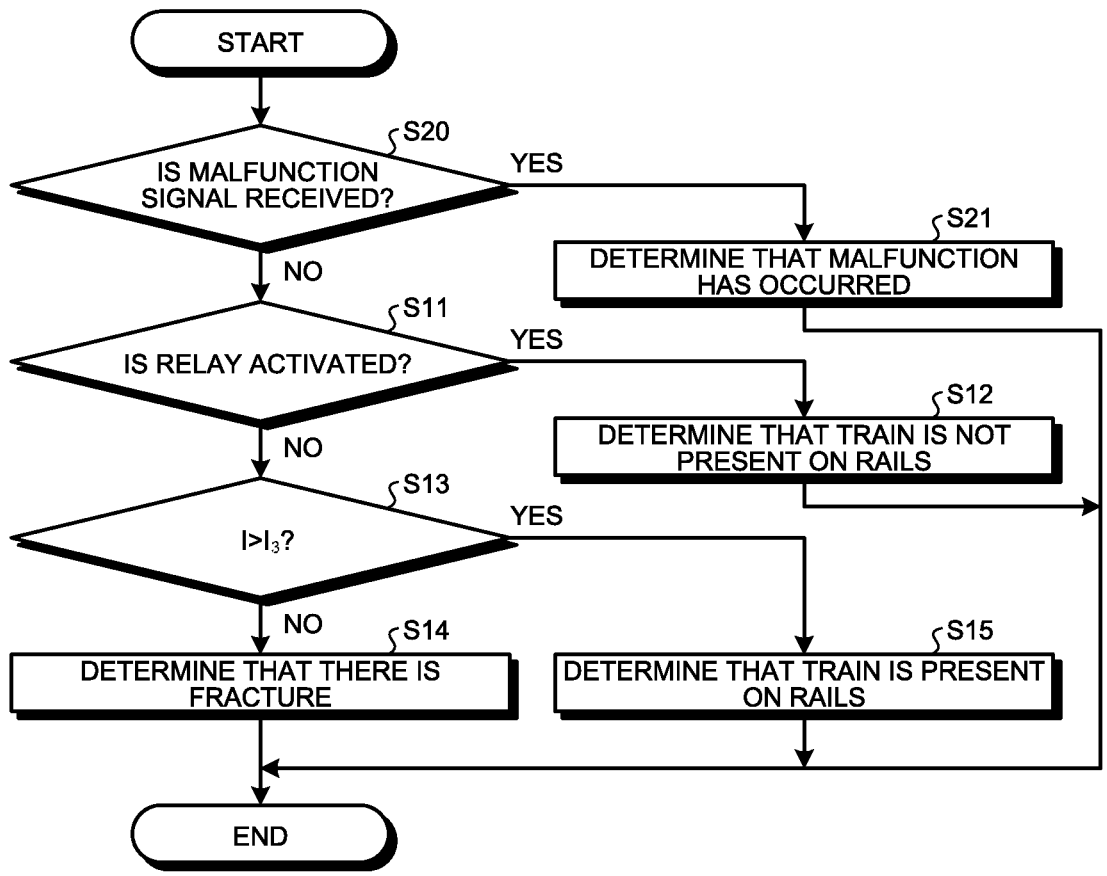
FIG. 7 is a flowchart illustrating an exemplary operation of a determination unit of the rail fracture detection device according to the second embodiment.

FIG. 7 is a flowchart illustrating an exemplary operation of the determination unit 41a of the rail fracture detection unit 4a illustrated in FIG. 6. First, the processing is started, and the determination unit 41a determines whether a malfunction signal is received (S20). In a case where the determination unit 41a receives the malfunction signal (S20: Yes), the determination unit 41a determines that a malfunction has occurred (S21) and terminates the processing. In a case where the determination unit 41a does not receive the malfunction signal (S20: No), the determination unit 41a determines whether the relay of the track circuit in the section that is a determination target is activated (S11). The processing after the determination is similar to the processing of FIG. 4 in the first embodiment.

According to the second embodiment, a malfunction of the transmission-unit power source 11 can be detected in advance by monitoring the output voltage of the transmission-unit power source 11.

Third Embodiment

Figure 8:
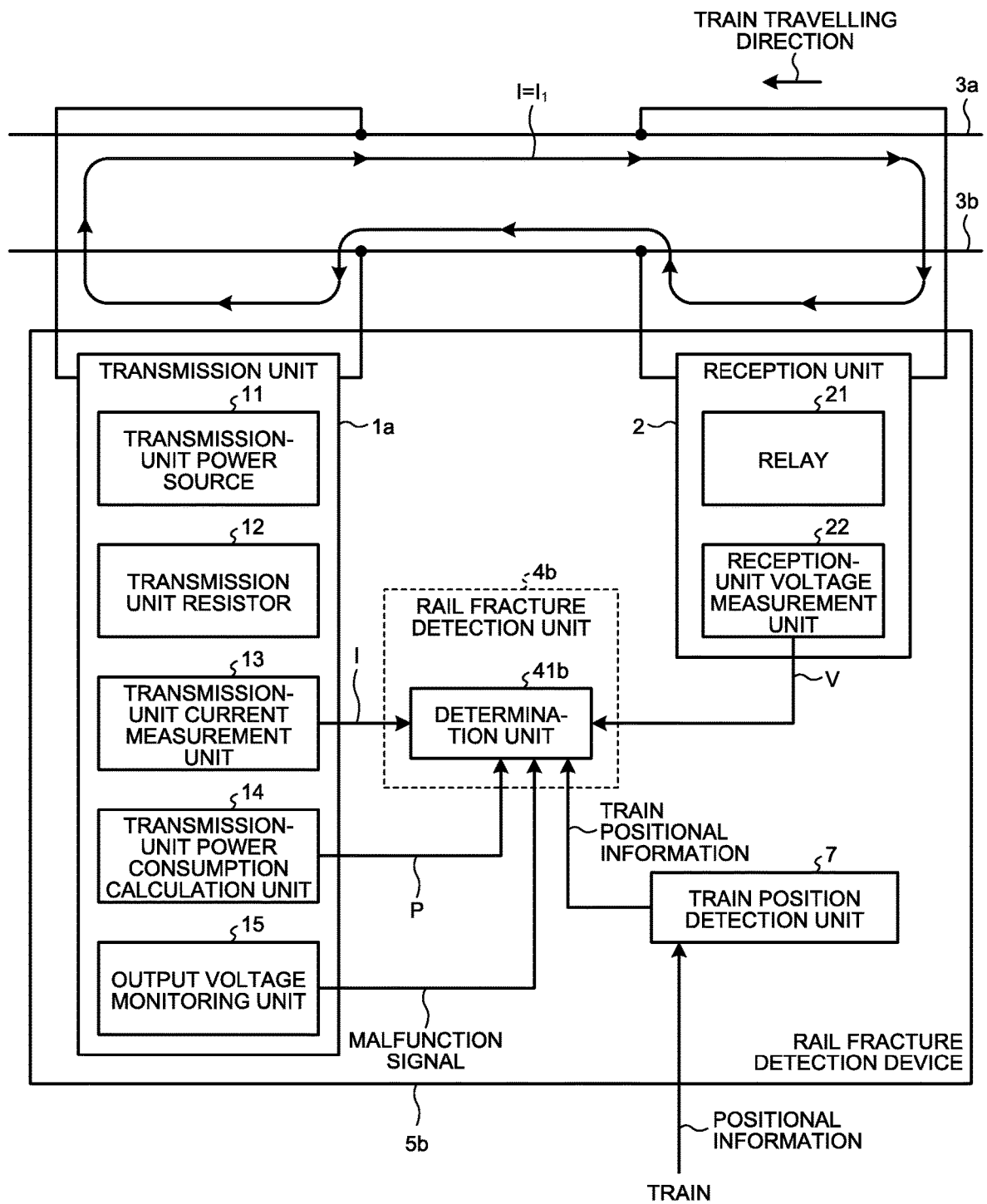
FIG. 8 is a diagram illustrating an exemplary configuration of a rail fracture detection device according to a third embodiment.

FIG. 8 is a diagram illustrating an exemplary configuration of a rail fracture detection device according to a third embodiment of the present invention. A rail fracture detection device 5b illustrated in FIG. 8 differs from the rail fracture detection device 5a illustrated in FIG. 6 in that it includes a rail fracture detection unit 4b in place of the rail fracture detection unit 4a and it further includes a train position detection unit 7. Any points not specifically mentioned here are referred to in the first embodiment.

The train position detection unit 7 outputs train positional information on a train present on a track including rails 3a and 3b. This train positional information is the train's own positional information acquired from a pulse signal from a tacho-generator and from absolute positional information from a ground coil. The tacho-generator is included in an on-board device mounted on the train present on the track and provided to the wheels of the train.

The rail fracture detection unit 4b includes a determination unit 41b. The determination unit 41b receives the current measurement value I from the transmission-unit current measurement unit 13, the voltage measurement value V from the reception-unit voltage measurement unit 22, the power consumption measurement value P from the transmission-unit power consumption calculation unit 14, and the train positional information from the train position detection unit 7.

Figure 9:
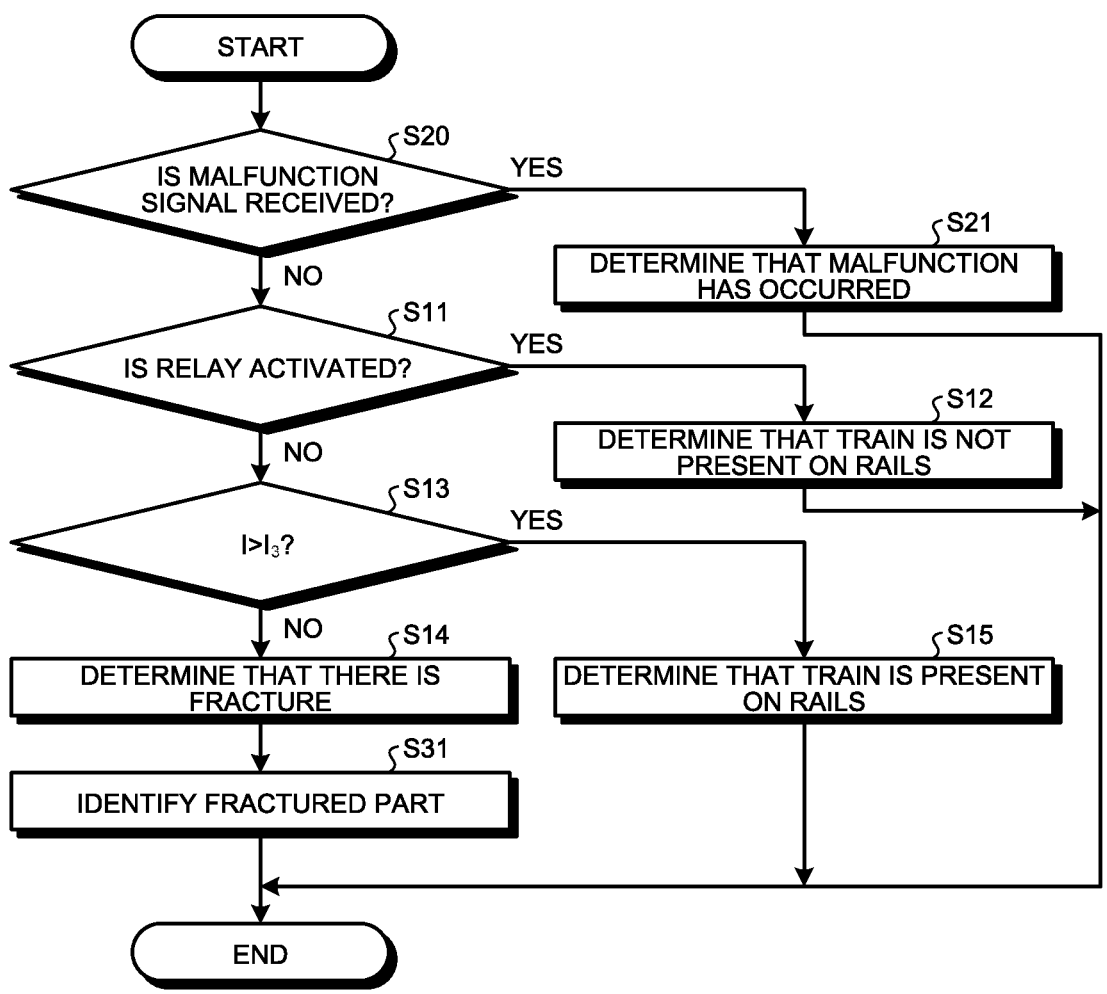
FIG. 9 is a flowchart illustrating an exemplary operation of a determination unit of the rail fracture detection device according to the third embodiment.

FIG. 9 is a flowchart illustrating an exemplary operation of the determination unit 41b of the rail fracture detection unit 4b illustrated in FIG. 8. The flowchart illustrated in FIG. 9 differs from the flowchart illustrated in FIG. 7 in the second embodiment in that in a case where it is determined that there is a fracture in the section of the track circuit (S14), a fractured part is identified (S31). Other processes are similar to those in FIG. 7 in the second embodiment.

Figure 10:
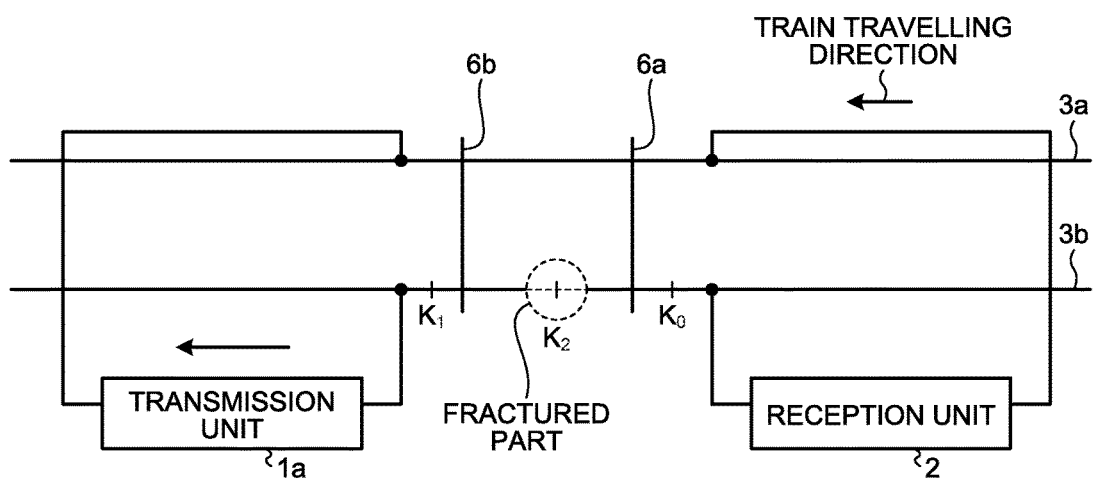
FIG. 10 is a diagram illustrating an exemplary schematic configuration when a rail fracture occurs in a section of a track circuit illustrated in FIG. 8.

FIG. 10 is a diagram illustrating an exemplary schematic configuration when a rail fracture occurs in the section of the track circuit illustrated in FIG. 8. In FIG. 10, axles 6a and 6b of a train present on the rails are illustrated, and there is a fractured part in the rail 3b. The axles 6a and 6b short-circuit the rail 3a and the rail 3b, and the travelling direction of the train is in the direction from the axle 6a toward the axle 6b. The axle 6a is located before the fractured part in the travelling direction, i.e., on the side closer to the reception unit 2 than the fractured part, and the axle 6b is located after the fractured part in the travelling direction, i.e., on the side closer to the transmission unit 1 than the fractured part.

Figure 11:
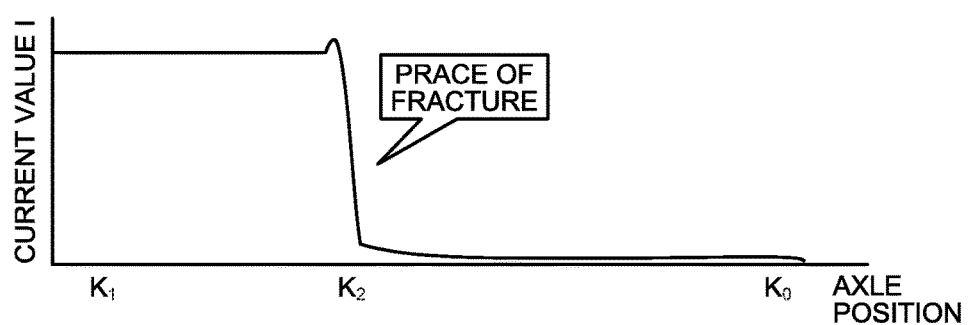
FIG. 11 is a graph illustrating an exemplary relation between a current value and an axle position, where the horizontal axis represents the axle position and the vertical axis represents the current value.

FIG. 11 is a graph illustrating an exemplary relation between the current value and the axle position, where the horizontal axis represents the axle position and the vertical axis represents the current value. First, when a train is present at the position of the axle 6a, because the position of the axle is between $K_0$ and $K_2$, the voltage measurement value V is lower than a preset threshold value. Thus, the relay is deactivated and the current measurement value I of the transmission-unit current measurement unit 13 at this point is the weak current $I_3$ as described above. With this current detection, it can be determined that there is a fractured part in the track circuit.

Then, when a train travels toward the position of the axle 6b and the axle passes the fractured part, the current measurement value I of the transmission-unit current measurement unit 13 increases as illustrated by $K_2$ in FIG. 11.

After that, when the train is present at the position of the axle 6b, because the position of the axle is between $K_2$ and $K_1$, the voltage measurement value V is lower than the preset threshold value. Thus, the relay is deactivated and the current measurement value I of the transmission-unit current measurement unit 13 at this point is $I_2$ described above due to a short-circuit caused by the axle.

The determination unit 41b of the rail fracture detection unit 4b illustrated in FIG. 8 refers to the train positional information from the train position detection unit 7, and then identifies, as a place of fracture, the position of the axle of the train at which the current measurement value I increases.

As described above, the rail fracture detection device according to the third embodiment includes the train position detection unit that acquires positional information from a train on the track circuit and outputs train positional information, and the determination unit identifies a fractured part of the rail on the basis of the train positional information and the current value or current measurement value. Here, the determination unit identifies, as the place of fracture, the position of the axle of the train at which the current measurement value I increases.

Note that the rail fracture detection device according to the third embodiment may include the transmission unit 1 in place of the transmission unit 1a.

Note that the configurations described in the first to third embodiments are exemplary content of the present invention and can be combined with another known technology, and furthermore, part of the configurations can be omitted or modified within the scope without departing from the spirit of the present invention.

REFERENCE SIGNS LIST 1, 1a transmission unit; 2 reception unit; 3a, 3b rail; 4, 4a, 4b rail fracture detection unit; 5, 5a, 5b rail fracture detection device; 6, 6a, 6b axle; 7 train position detection unit; 11 transmission-unit power source; 12 transmission-unit resistor; 13 transmission-unit current measurement unit; 14 transmission-unit power consumption calculation unit; 15 output voltage monitoring unit; 21 relay; 22 reception-unit voltage measurement unit; 41, 41a, 41b determination unit; 42 processor; 43 memory; 44 input unit.

The invention claimed is:

1. A rail fracture detection device comprising:
a processor; and
memory storing instructions that, when executed, cause the processor to:
in a case where relay information on a track circuit indicates deactivation of a relay of the track circuit and a current value of a current flowing in the track circuit is larger than a preset first current value, determine that a train is present on a rail, and in a case where the relay information on the track circuit indicates deactivation of the relay and the current value is lower than or equal to the preset first current value, determine that there is a rail fracture.

2. The rail fracture detection device according to claim 1, comprising a transmitter that is provided between two rails but is located after a receiver including the relay of the track circuit in a travelling direction of a train and that forms a current loop with the receiver and the two rails, wherein the transmitter includes a power consumption calculator to calculate a power consumption on a basis of a voltage value of a transmitter power source and a current value of a current flowing in a transmitter resistor.

3. The rail fracture detection device according to claim 1, comprising a train position detector to acquire positional information from a train on the track circuit and output train positional information, wherein a rail fractured part is identified on a basis of the train positional information and the current value.

4. A rail fracture detection device comprising:

a receiver provided between two rails and including a relay of a track circuit;

a transmitter that is provided between the two rails but is located after the receiver in a travelling direction of a train and that forms a current loop with the receiver and the two rails; and a determiner to determine presence or absence of a fracture in the two rails and presence or absence of a train on the rails on a basis of information from the receiver and information from the transmitter, wherein the receiver includes a receiver voltage measurer to measure a voltage applied to the relay, the transmitter includes a transmitter power source to generate the current, a transmitter resistor connected in series with the transmitter power source, and a transmitter current measurer to measure a current in the transmitter resistor, and the determiner determines that a train is present on the rails in a case where a voltage value measured by the receiver voltage measurer is lower than a preset threshold value and a current value measured by the transmitter current measurer is larger than a preset first current value, and the determiner determines that there is a rail fracture in a case where the voltage value measured by the receiver voltage measurer is lower than the preset threshold value and the current value measured by the transmitter current measurer is lower than or equal to the preset first current value.

5. The rail fracture detection device according to claim 4, wherein the transmitter includes a power consumption calculator to calculate a power consumption on a basis of a voltage value of the transmitter power source and a current value of a current flowing in the transmitter resistor.

6. The rail fracture detection device according to claim 4, comprising a train position detector to acquire positional information from a train on the track circuit and output train positional information, wherein the determiner identifies a rail fractured part on a basis of the train positional information and the current value.

7. The rail fracture detection device according to claim 1, wherein the track circuit is provided in a section including a curved portion of a railroad.

8. The rail fracture detection device according to claim 1, wherein the track circuit is provided in a section including a welded portion of a railroad.

9. The rail fracture detection device according to claim 4, wherein the track circuit is provided in a section including a curved portion of a railroad.

10. The rail fracture detection device according to claim 4, wherein the track circuit is provided in a section including a welded portion of a railroad.

11. The rail fracture detection device according to claim 1, wherein the preset first current value is a value which is a current measured when the rail fracture occurs in a section of the track circuit.

* * * * *